US012615000B2

(12) United States Patent
Gupta et al.

(10) Patent No.: US 12,615,000 B2
(45) Date of Patent: Apr. 28, 2026

(54) POWER SUPPLY DEVICE FOR A HYBRID OR ELECTRIC VEHICLE

(71) Applicant: FORD GLOBAL TECHNOLOGIES, LLC, Dearborn, MI (US)

(72) Inventors: Man Prakash Gupta, Dearborn, MI (US); Kewei Xiao, Canton, MI (US); Alfredo R. Munoz, Ann Arbor, MI (US); Michael W. Degner, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 70 days.

(21) Appl. No.: 18/488,223

(22) Filed: Oct. 17, 2023

(65) Prior Publication Data

US 2025/0125757 A1     Apr. 17, 2025

(51) Int. Cl.
| | |
|---|---|
| *H02P 27/06* | (2006.01) |
| *B60L 50/60* | (2019.01) |
| *H05K 7/20* | (2006.01) |

(52) U.S. Cl.
CPC .............. *H02P 27/06* (2013.01); *B60L 50/60* (2019.02); *H05K 7/20927* (2013.01); *B60L 2210/40* (2013.01)

(58) Field of Classification Search
CPC ...... H02P 27/06; B60L 50/60; B60L 2210/40; B60L 15/007; H05K 7/20927; H05K 7/2089; H05K 7/20936; H02M 7/5387
See application file for complete search history.

(56) References Cited

U.S. PATENT DOCUMENTS

| | | | | |
|---|---|---|---|---|
| 9,615,490 | B2 * | 4/2017 | Topolewski | ....... H05K 7/20927 |
| 10,717,366 | B1 | 7/2020 | Jaksic et al. | |
| 10,912,231 | B1 | 2/2021 | Chen et al. | |
| 11,677,331 | B2 | 6/2023 | Frampton et al. | |
| 2009/0021971 | A1 * | 1/2009 | Korich | ............... H05K 7/20927 363/141 |
| 2011/0058391 | A1 * | 3/2011 | Ueno | .................... H02M 7/003 363/13 |
| 2011/0285223 | A1 * | 11/2011 | Miyachi | ................. H02K 11/33 310/68 D |
| 2012/0162912 | A1 * | 6/2012 | Kim | .................... H05K 7/20909 361/692 |
| 2012/0206950 | A1 * | 8/2012 | Duppong | ............... H05K 7/209 363/141 |
| 2014/0313671 | A1 | 10/2014 | Sugita et al. | |
| 2017/0033638 | A1 * | 2/2017 | Lei | ..................... H02K 11/0094 |
| 2018/0145603 | A1 * | 5/2018 | Kim | .................. H05K 7/20845 |
| 2023/0164961 | A1 | 5/2023 | Rettner et al. | |
| 2024/0313665 | A1 * | 9/2024 | Heo | ..................... H02M 7/003 |

FOREIGN PATENT DOCUMENTS

| | | | | |
|---|---|---|---|---|
| GB | 2242580 A | * 10/1991 | ............ H02M 7/003 |

* cited by examiner

*Primary Examiner* — Bickey Dhakal
(74) *Attorney, Agent, or Firm* — David B Kelley; Brooks Kushman P.C.

(57) ABSTRACT

An inverter includes power cards and link capacitors. The power cards have inverting circuitry configured to convert DC power provided by a power source into AC power. The link capacitors are configured to absorb ripple currents generated by the inverting circuitry or the power source. The link capacitors and power cards are aligned along an axis. The power cards are spatially interleaved with link capacitors.

20 Claims, 6 Drawing Sheets

POWER SUPPLY DEVICE FOR A HYBRID OR ELECTRIC VEHICLE

TECHNICAL FIELD

The present disclosure relates to electric vehicles and power supply devices for electric vehicles.

BACKGROUND

Electric and hybrid vehicles may include power modules that are configured to convert electrical power from direct electrical current (DC) into alternating electrical current (AC) and/or vice versa.

SUMMARY

A vehicle includes an electric machine, a battery, and an inverter. The electric machine is configured to propel the vehicle. The battery is configured to provided electrical power to the electric machine. The inverter is configured to convert DC electrical power from the battery into AC electrical power and to deliver the AC electrical power to the electric machine. The inverter comprises a plurality of power cards and a plurality of DC link capacitors. The power cards and the DC link capacitors are spatially arranged in an alternating configuration along an array. Each power card is sandwiched between two of the DC link capacitors or between one of the DC link capacitors and a first end cover. Each DC link capacitor is sandwiched between two of the power cards or between one of the power cards and a second end cover.

An inverter includes a plurality of switching units and a plurality of link capacitors. Each switching unit has a primary housing and a circuit disposed within the primary housing. The switching units are configured to convert DC power provided by a power source into AC power. Each link capacitor has a secondary housing and a capacitive element disposed within the secondary housing. The link capacitors are configured to absorb ripple currents generated by the switching units or the power source. The primary housings are interleaved with the secondary housings. The primary and secondary housings collectively define cooling channels.

An inverter includes power cards and link capacitors. The power cards have inverting circuitry configured to convert DC power provided by a power source into AC power. The link capacitors are configured to absorb ripple currents generated by the inverting circuitry or the power source. The link capacitors and power cards are aligned along an axis. The power cards are spatially interleaved with link capacitors.

DETAILED DESCRIPTION

Embodiments of the present disclosure are described herein. It is to be understood, however, that the disclosed embodiments are merely examples and other embodiments may take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for applications or implementations.

Figure 1:
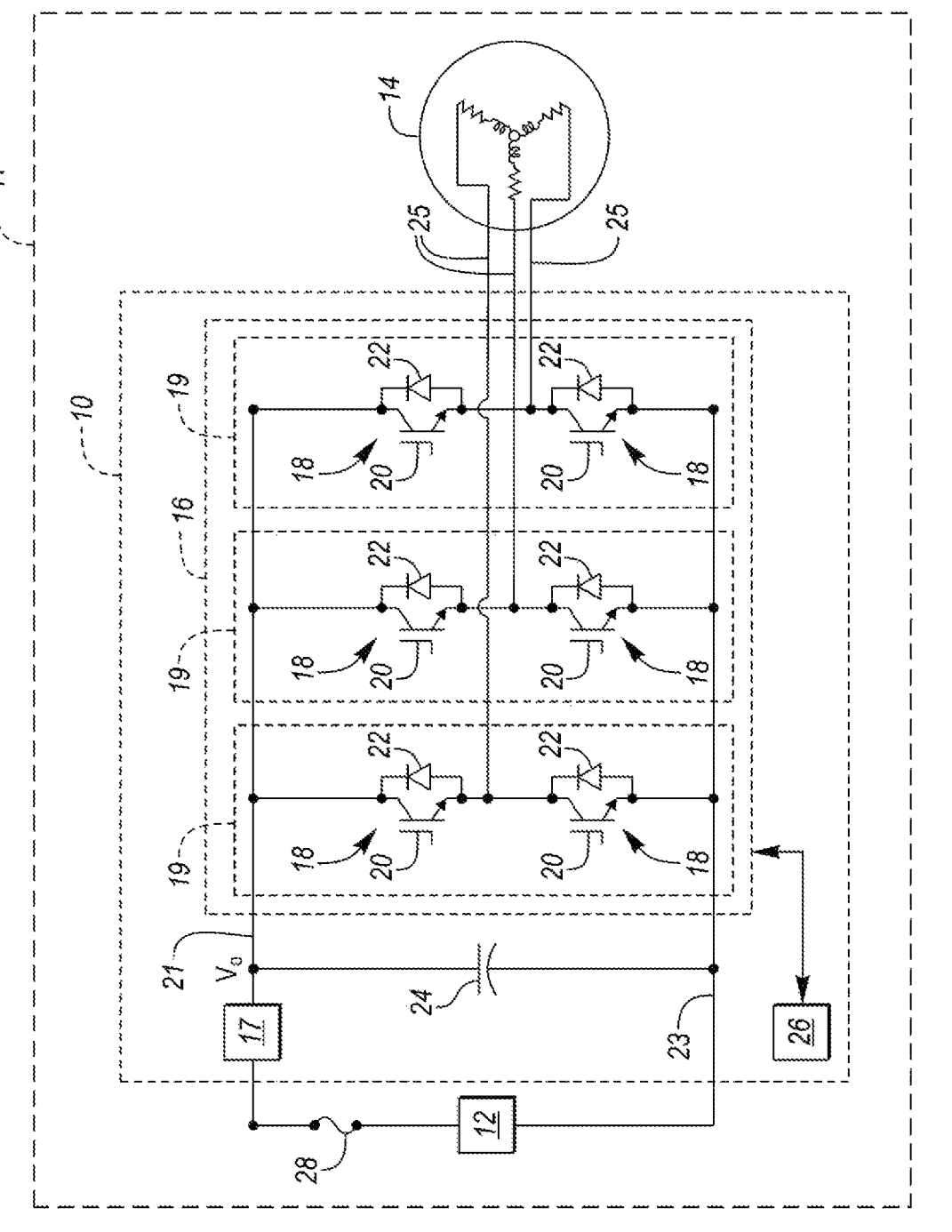
FIG. 1 is a circuit diagram of an inverter that is coupled to a DC power source and an electric machine.
Figure 2:
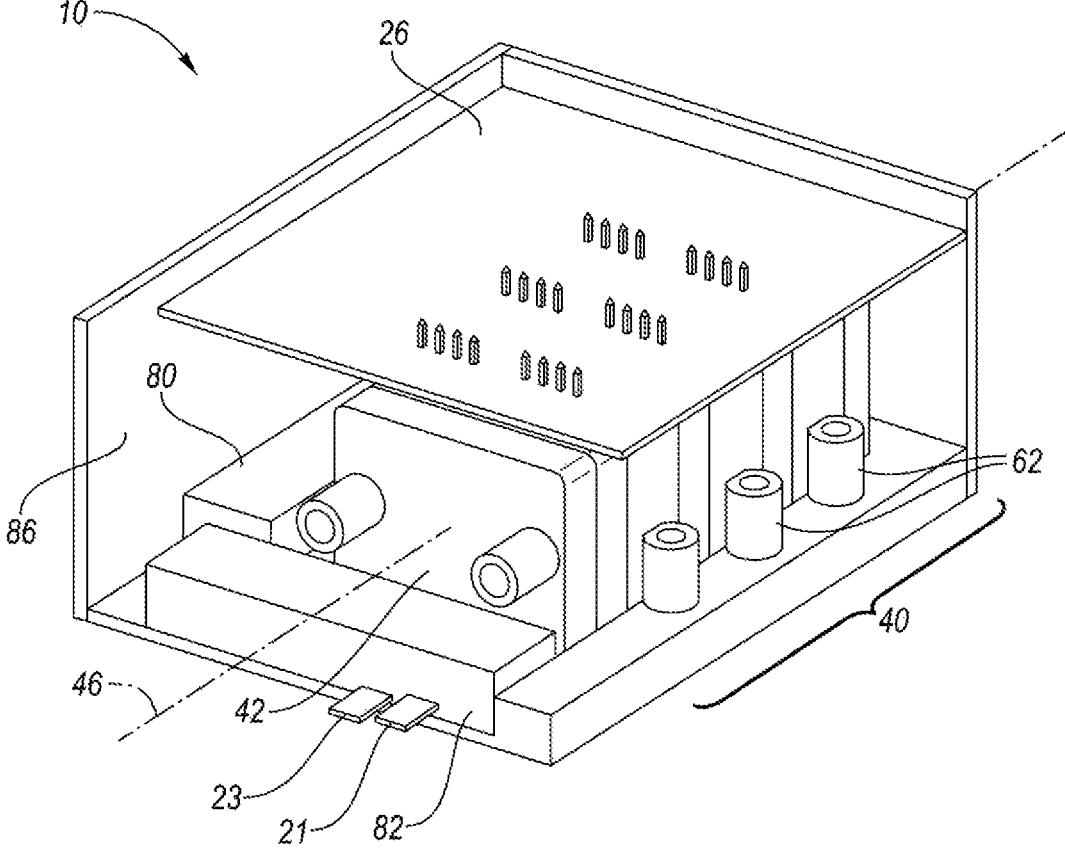
FIG. 2 is an isometric front view of the inverter.
Figure 3:
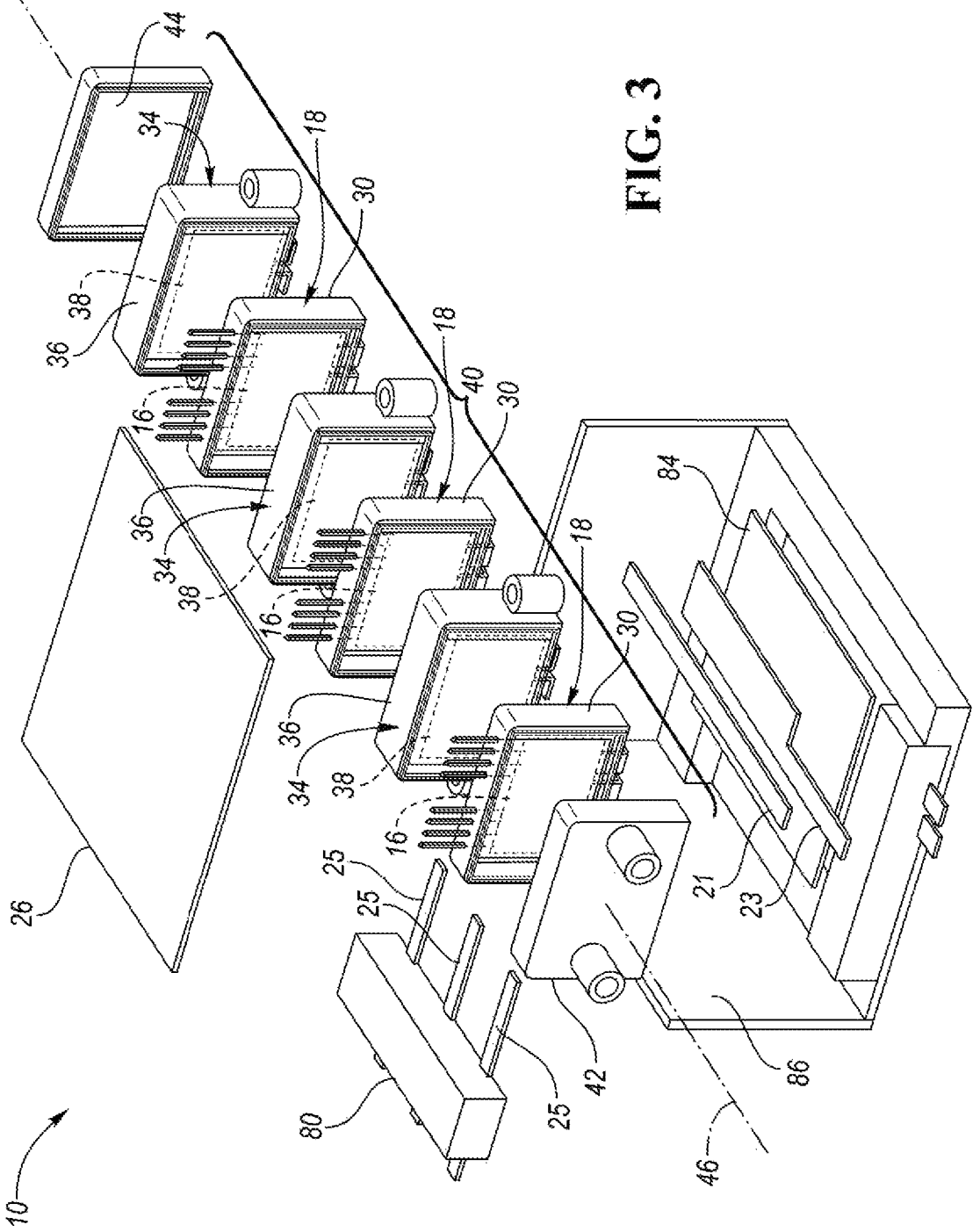
FIG. 3 is an isometric front-exploded view of the inverter.
Figure 4:
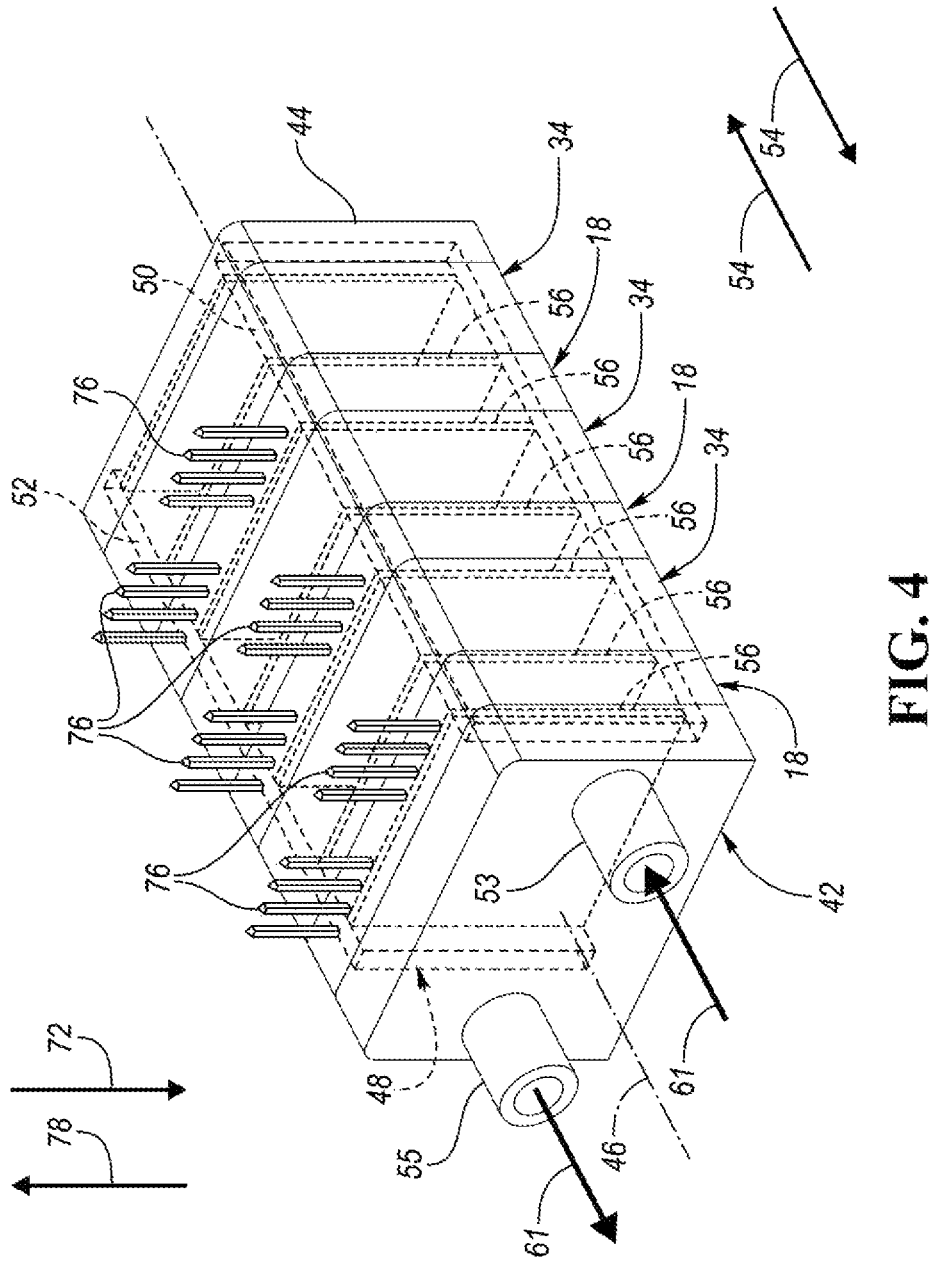
FIG. 4 is a front-top view of an array of power cards and linking capacitors that form a portion of the inverter.
Figure 5:
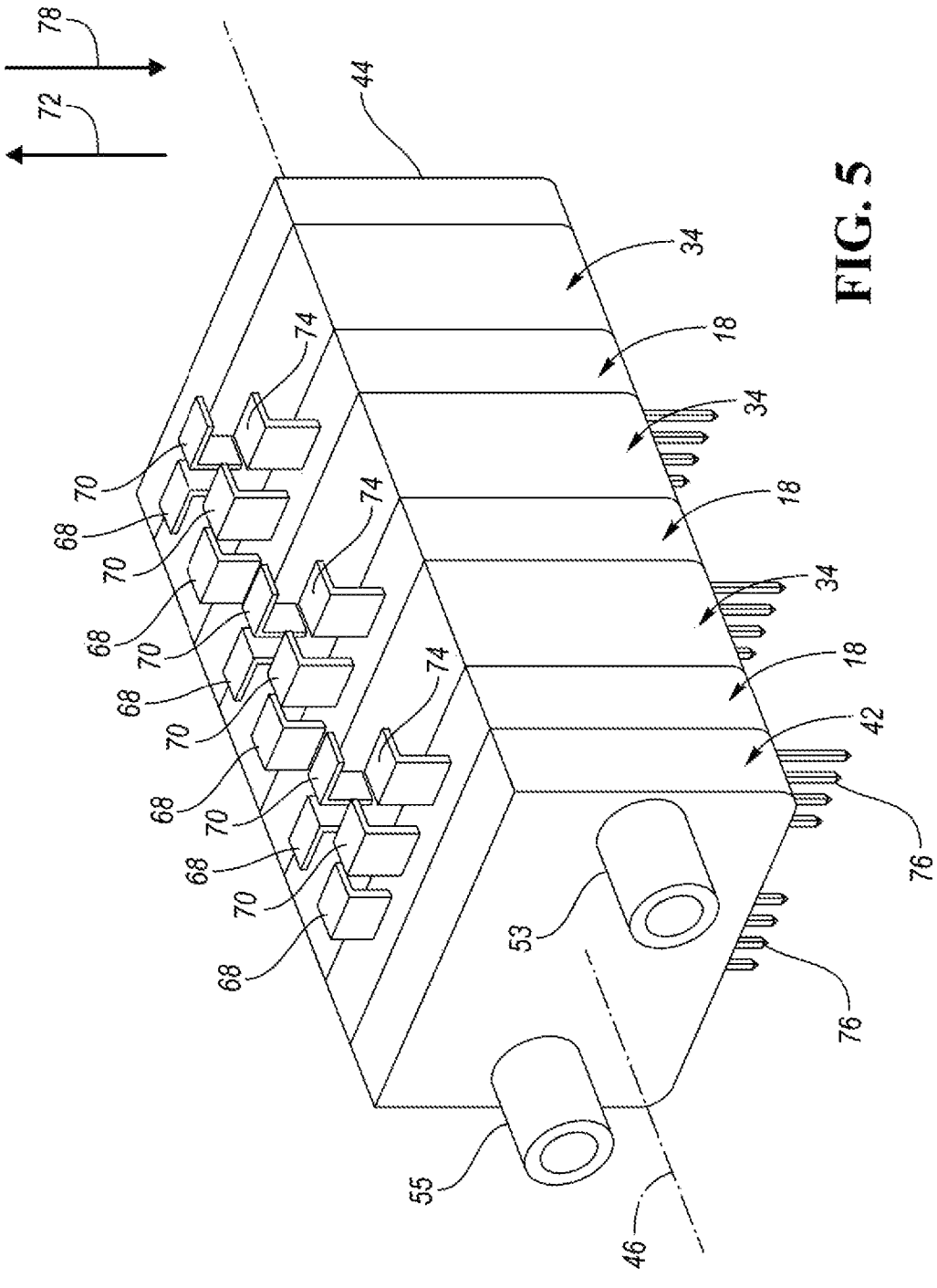
FIG. 5 is a front-bottom view of the array of power cards and linking capacitors that form a portion of the inverter.

Referring to FIG. 1, a circuit diagram of an inverter 10 coupled to a power source 12 and an electric machine 14 is illustrated. The inverter 10 may also be referred to as a power controller, power module, or a power supply device. The electric machine may be an electric motor or a motor/generator combination. The inverter 10 may be utilized in an electric drive system of a vehicle 11, such as an electric or hybrid vehicle. The power source 12 may be coupled to the inverter 10 in order to drive the electric machine 14. In some contexts, including the context of an electric or hybrid vehicle, the power source 12 may be a battery, such as a traction battery that is configured to provided electrical power to the electric machine 14, and the electric machine 14 may be an electric motor or an electric motor/generator combination, that is configured to propel the vehicle 11. The inverter 10 may include inverting circuitry 16 and a voltage converter 17. The voltage converter 17 may be DC to DC converter. Alternatively, the voltage converter 17 may be a separate component that is not integral to the inverter 10. The inverting circuitry 16 and the voltage converter 17 may be configured to deliver electrical power to the electric machine 14.

The inverting circuitry 16 may include switching units 18. The switching units 18 may be referred to switching circuits or switches. The switching units 18 may each comprise a transistor 20, such as an insulated gate bipolar transistor (IGBT), in antiparallel with a diode 22. Alternatively, other types of circuits may be utilized, such as metal-oxide semiconductor field-effect transistors (MOSFETs), to form the switching units 18. Pairs 19 of the switching units 18 are arranged in series and extend between the positive DC bus 21 and negative DC bus 23 of the power source 12. The pairs 19 of switching units 18 each comprise a half-bridge 19 of the inverting circuitry 16. Each half-bridge 19 is connected to one phase of the electric machine 14 via an AC bus 25. The switching units 18 may be configured to provide AC power to the electric machine 14. More specifically, the inverting circuitry 16 may be configured to convert DC power provided by the power source 12 into AC power, which is then delivered to the electric machine 14. The inverter 10 may include a DC-link capacitor 24. The link capacitor 24 may be disposed between the power source 12 and the inverting circuitry 16. The link capacitor 24 also extends between the positive DC bus 21 and negative DC bus 23 of the power source 12. The link capacitor 24 may be configured to absorb ripple currents generated at the inverting circuitry 16 or the power source 12, and stabilize the DC-link voltage, Vo, for inverting circuitry 16 control. Stated in other terms, the link capacitor 24 may be arranged to limit voltage variation at an input of inverting circuitry 16 due to ripple currents generated by the inverting circuitry 16 or a battery, such as a traction battery, that may comprise the power source 12. The inverter 10 may include a drive board 26 for controlling the inverting circuitry 16. The drive board 26 may be a gate drive board that is configured to operate the transistors 20 of the switching units 18 when converting the DC power from the power source 12 into AC power and delivering the AC power to the electric machine 14.

The voltage converter 17 may include an inductor. The circuitry of the voltage converter (not shown), including the inductor, may be configured to amplify or increase the voltage of the electrical power being delivered to the electric machine 14 from the power source 12. A fuse 28 may be disposed on the direct current side of the inverting circuitry 16 to protect the inverting circuitry 16 from surges in electrical power.

The disclosure should not be construed as limited to the circuit diagram of FIG. 1, but should include power control devices that include other types inverting circuitry, capacitors, converters, or combinations thereof. For example, the inverting circuitry 16 may be an inverter that includes any number of switching units and is not limited to the number of switching units depicted in FIG. 1. As another example, the link capacitor 24 may include several capacitors as opposed to the single capacitor illustrated in FIG. 1.

Referring to FIGS. 2-7, the inverter 10 is further illustrated. The switching units 18 may each further include an external housing 30. The inverting circuitry 16 (e.g., one of the transistors 20 and a corresponding diode 22) of each switching unit 18 may be disposed within one of the housings 30. Each switching unit 18, including a corresponding housing 30 and the corresponding inverting circuitry 16, may be referred to as a power card. The housings 30 may each comprise an electrically insulating mold, such as an epoxy mold, that is disposed over the corresponding inverting circuitry 16.

The DC link capacitor 24 may include a plurality of sub-capacitors 34. The sub-capacitors 34 may be electrically arranged in parallel. The sub-capacitors 34 individually may be referred to as DC link capacitors. Each sub-capacitor 34 includes an external housing 36 and a capacitive element 38 that is disposed within a respective housing 36. The housings 36 may each comprise an electrically insulating mold, such as an epoxy mold, that is disposed over a corresponding capacitive element 38. Each housing 30 may be referred to as a primary housing while each housing 36 may be referred to as a secondary housing, or vice versa.

The switching units 18 and the sub-capacitors 34 are spatially arranged in an alternating configuration along an array 40 such that (i) each switching unit 18 is sandwiched between two of the sub-capacitors 34 or between one of the sub-capacitors 34 and a first end cover 42 and (ii) each sub-capacitor 34 is sandwiched between two of the switching units 18 or between one of the switching units 18 and a second end cover 44. The first end cover 42 may be a front cover disposed along a front end of the array 40 while the second end cover may be a rear or back cover disposed along a rear or back end of the array 40, or vice versa. Stated in other terms, the sub-capacitors 34 and switching units 18 are aligned along an axis 46 and the switching units 18 are spatially interleaved with the sub-capacitors 34. It is further noted that the primary housings 30 are interleaved with the secondary housings 36, and that the primary housings 30 and the secondary housings 36 are aligned along the axis 46.

The primary housings 30 and the secondary housings 36 collectively define cooling channels 48. The cooling channels 48 include an inflowing cooling channel 50 and an outflowing cooling channel 52. The inflowing cooling channel 50 and the outflowing cooling channel 52 each extend through each primary housing 30 and each secondary housing 36. The inflowing cooling channel 50 and the outflowing cooling channel 52 are aligned along the array. The inflowing cooling channel 50 and the outflowing cooling channel 52 are aligned along directions 54 that are substantially parallel with the axis 46. Substantially parallel may refer to any incremental angle that is between exactly parallel and 15° from exactly parallel. The first end cover 42 or the second end cover 44 may define an inlet 53 to the inflowing cooling channel 50 and an outlet 55 from the outflowing cooling channel 52.

Figures 6, 7:
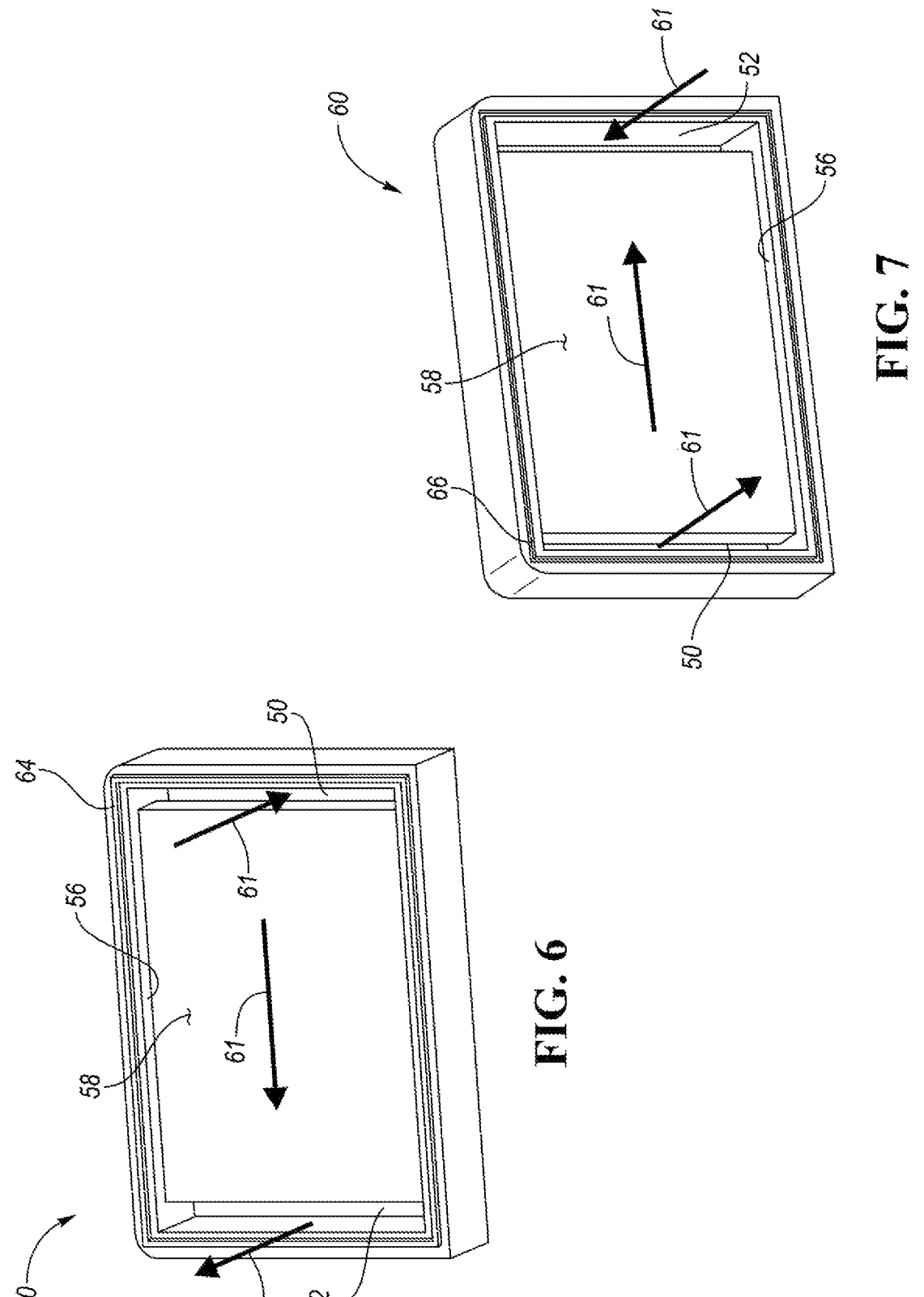
FIG. 6 is a front view of a generic housing that houses either the circuitry for a single power card or the capacitive element of one the linking capacitors.
FIG. 7 is a rear view of the generic housing that houses either the circuitry for a single power card or the capacitive element of one the linking capacitors.

The cooling channels 48 further include transverse cooling channels 56 that extend between the inflowing cooling channel 50 and the outflowing cooling channel 52. The transverse cooling channels 56 are configured to direct coolant between adjacent switching units 18 and sub-capacitors 34. More specifically, internal surfaces or faces 58 of a housing 60, which is illustrated in FIGS. 6 and 7, may be recessed so as to define the transverse cooling channels 56. Flow direction of a coolant (e.g., water or glycol) through the cooling channels 48 is illustrated by arrows 61.

It is noted that the housing 60 in FIGS. 6 and 7 may be representative of either a primary housing 30 or a secondary housing 36. It is further noted that the recesses defining the transverse cooling channels 56 may only be present in one of the primary housing 30 or the secondary housing 36 in adjacent pairs that includes one primary housing 30 and one secondary housing 36. For example, the internal faces 58 may only be recessed in the primary housing 30 and not the secondary housings 36 or vice versa. Furthermore, the dimensions and features of the primary housings 30 and the secondary housings 36 may deviate from the housing 60 illustrated in FIGS. 6 and 7. For example, the thickness of the secondary housing 36 (i.e., the dimension of the secondary housing 36 along axis 46) may be greater than the thickness of the primary housing 30 (i.e., the dimension of the primary housing 30 along axis 46), or vice vera. As another example, the secondary housings 36 may include mounting features, such as eyelets 62, while the primary housings 30 do not, or vice versa.

The primary housings 30 and the secondary housings 36 each include aligning features that are configured to align the adjacent the switching units 18 and sub-capacitors 34 to each other, and to align all of the switching units 18 and sub-capacitors 34 along the array 40 and along axis 46. The aligning features may include (i) protrusions 64 that extend outward from forward faces of an outer peripheral region of the primary and secondary housings 30, 36 and (ii) recesses or grooves 66 that are defined by rearward faces of the outer peripheral region of the primary and secondary housings 30, 36, or vice versa. The protrusions 64 are configured to engage the grooves 66 to align the adjacent housings 30, 36 and to align the switching units 18 and sub-capacitors 34 along the along the array 40 and along axis 46. Engagement between the protrusions 64 and the grooves 66 may also operate to create a seal to prevent coolant from leaking out of the cooling channels 48 in the spaces between adjacent housings 30, 36. One of the first end cover 42 and the second end cover 44 may include one of the protrusions 64 while the other of the first end cover 42 and the second end cover 44 may define one of the grooves 66.

The switching units 18 and the sub-capacitors 34 each include positive DC bus terminals 68 and negative DC bus terminals 70. The positive and negative DC bus terminals 68, 70 that are connected to the switching units 18 may extend from the inverting circuitry 16 and through the primary housings 30 in direction 72. The positive and negative DC bus terminals 68, 70 that are connected to the sub-capacitors 34 may extend from the capacitive elements 38 and through the secondary housings 36 in direction 72. Direction 72 may be transverse to the array 40, transverse to the interleaving of the primary and secondary housings 30, 36, and/or transverse to the axis 46. Direction 72 may be substantially perpendicular to the array 40 or to the axis 46. Substantially perpendicular may refer to any incremental angle that is between exactly perpendicular and 15° from exactly perpendicular.

The switching units 18 may further include AC phase bus terminals 74. The AC phase bus terminals 74 may also extend from the inverting circuitry 16 and through the primary housings 30 in direction 72. The switching units 18 may further include switching signal terminals 76. The switching signal terminals 76 may extend from the inverting circuitry 16 and through the primary housings 30 in direction 78. Direction 78 may be transverse to the array 40, transverse to the interleaving of the primary and secondary housings 30, 36, and/or transverse to the axis 46. Direction 78 may be substantially perpendicular to the array 40 or to the axis 46. Substantially perpendicular may refer to any incremental angle that is between exactly perpendicular and 15° from exactly perpendicular. Direction 78 may be the opposite of direction 72.

The positive DC bus terminals 68 may each be electrically connected to the positive DC bus 21. The negative DC bus terminals 70 may each be electrically connected to the negative DC bus 23. The AC phase bus terminals 74 may be electrically connected to the AC bus 25 or to one of a plurality of AC phase busbars 25. The switching signal terminals 76 may be electrically connected to the drive board 26. The positive DC bus terminals 68 and the negative DC bus terminals 70 may be the opposite of what is illustrated (i.e., the callout number 68 may refer to the negative DC bus terminals while the call out number 70 may refer to the positive DC bus terminals). The positive DC bus 21 and the negative DC bus 23 may also be the opposite of what is illustrated (i.e., the callout number 21 may refer to the negative DC bus while the call out number 23 may refer to the positive DC bus).

An AC current sensor 80 may be secured to the AC bus 25 and may be configured to communicated current flow through the AC bus 25 back to a system controller, such as a vehicle controller. An electromagnetic interference (EMI) filter 82 (which may consist of DC choke, Y-capacitor, etc.) may be electrically connected to the positive DC bus 21 and/or to the negative DC bus 23. A thermal pad 84 may be disposed between the DC bus bars (e.g., the positive DC bus 21 and the negative DC bus 23) and a housing 86. The thermal pad 84 is configured to increase or enhance passive heat transfer between DC busbars (e.g., the positive DC bus 21 and the negative DC bus 23) and the housing 86. The housing 86 is configured to house the components of the inverter 10. The inverter components, including each switching unit 18, the DC link capacitor 24 (including each sub-capacitors 34), the positive DC bus 21, the negative DC bus 23, the AC bus 25, AC current sensor 80, the EMI filter 82, the thermal pad 84, the drive board 26, the first end cover 42, and the second end cover 44 may be secured to and/or disposed within the housing 86.

A system controller, such as a vehicle controller described herein, may be part of a larger control system and may be controlled by various other controllers throughout the vehicle 11. It should therefore be understood that such a controller and one or more other controllers can collectively be referred to as a "controller" that controls various actuators in response to signals from various sensors to control functions the vehicle 11 or vehicle subsystems. Such a controller may include a microprocessor or central processing unit (CPU) in communication with various types of computer readable storage devices or media. Computer readable storage devices or media may include volatile and nonvolatile storage in read-only memory (ROM), random-access memory (RAM), and keep-alive memory (KAM), for example. KAM is a persistent or non-volatile memory that may be used to store various operating variables while the CPU is powered down. Computer-readable storage devices or media may be implemented using any of a number of known memory devices such as PROMs (programmable read-only memory), EPROMs (electrically PROM), EEPROMs (electrically erasable PROM), flash memory, or any other electric, magnetic, optical, or combination memory devices capable of storing data, some of which represent executable instructions, used by such a controller in controlling the vehicle 11 or vehicle subsystems.

Control logic or functions performed by such a controller may be represented by flow charts or similar diagrams in one or more figures. These figures provide representative control strategies and/or logic that may be implemented using one or more processing strategies such as event-driven, interrupt-driven, multi-tasking, multi-threading, and the like. As such, various steps or functions illustrated may be performed in the sequence illustrated, in parallel, or in some cases omitted. Although not always explicitly illustrated, one of ordinary skill in the art will recognize that one or more of the illustrated steps or functions may be repeatedly performed depending upon the particular processing strategy being used. Similarly, the order of processing is not necessarily required to achieve the features and advantages described herein, but is provided for case of illustration and description. The control logic may be implemented primarily in software executed by a microprocessor-based vehicle, engine, and/or powertrain controller. Of course, the control logic may be implemented in software, hardware, or a combination of software and hardware in one or more controllers depending upon the particular application. When implemented in software, the control logic may be provided in one or more computer-readable storage devices or media having stored data representing code or instructions executed by a computer to control the vehicle or its subsystems. The computer-readable storage devices or media may include one or more of a number of known physical devices which utilize electric, magnetic, and/or optical storage to keep executable instructions and associated calibration information, operating variables, and the like.

In a traction inverter (e.g., an inverter used in a hybrid or electric vehicle), the power module (e.g., a housing that includes the inverting circuitry 16), and DC link capacitor (e.g., link capacitor 24) are typically two separate components, which are connected through a busbar during the assembly. The power module, dc-link capacitor, busbar, and a heat sink (e.g., thermal pad 84) may take significant space when assembled. The current design is an integrated design where elements of the power module (e.g., the switching units 18) with the DC link capacitor (e.g., the sub-capacitors 34 that collectively comprise the DC link capacitor 24) are stacked in an interleaving manner. Such a design provides the following advantages: (i) an overall size reduction of the inverter due to compact packaging; (ii) a decrease in parasitic inductances due to shorter power loops; (iii) increased cooling due to increased surface area for heat removal; (iv) ease of manufacturing and assembly; (v) modular and scalable design; and (vi) decrease expense.

It should be understood that the designations of first, second, third, fourth, etc. for any component, state, or condition described herein may be rearranged in the claims so that they are in chronological order with respect to the claims. Furthermore, it should be understood that any component, state, or condition described herein that does not have a numerical designation may be given a designation of first, second, third, fourth, etc. in the claims if one or more of the specific component, state, or condition are claimed.

The words used in the specification are words of description rather than limitation, and it is understood that various changes may be made without departing from the spirit and scope of the disclosure. As previously described, the features of various embodiments may be combined to form further embodiments that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. As such, embodiments described as less desirable than other embodiments or prior art implementations with respect to one or more characteristics are not outside the scope of the disclosure and may be desirable for particular applications.

What is claimed is:

1. An inverter comprising:
a plurality of switching units, each switching unit having (i) a primary housing and (ii) a circuit disposed within the primary housing, wherein the switching units are configured to convert DC power provided by a power source into AC power; and
a plurality of link capacitors, each link capacitor having (i) a secondary housing and (ii) a capacitive element disposed within the secondary housing, wherein (a) the link capacitors are configured to absorb ripple currents generated by the switching units or the power source, (b) the primary housings are interleaved with the secondary housings, and (c) the primary and secondary housings collectively define cooling channels, wherein the cooling channels include an inflowing cooling channel and an outflowing cooling channel, and wherein the inflowing cooling channel and the outflowing cooling channel extend through each of the primary and secondary housings.

2. The inverter of claim 1, wherein the cooling channels include transverse cooling channels that (i) extend between the inflowing cooling channel and the outflowing cooling channel and (ii) are configured to direct coolant between adjacent switching units and link capacitors.

3. The inverter of claim 1 further comprising switching signal terminals extending (i) from each of the circuits and (ii) through the primary housings in a direction that is transverse to the interleaving of the primary and secondary housings.

4. The inverter of claim 3 further comprising bus terminals extending (i) from each of the circuits and each of the capacitive elements and (ii) through the primary and secondary housings, respectively, in a second direction that is (a) opposite to the direction and (b) transverse to the interleaving of the primary and secondary housings.

5. An inverter comprising:
power cards having inverting circuitry configured to convert DC power provided by a power source into AC power; and
link capacitors configured to absorb ripple currents generated by the inverting circuitry or the power source, wherein (i) the link capacitors and power cards are aligned along an axis and (ii) the power cards are spatially interleaved with link capacitors, wherein (a) each of the power cards and each of the link capacitors includes an external housing, (b) each of the external housings is aligned along the axis and defines cooling channels, and (c) the cooling channels include an inflowing cooling channel and an outflowing cooling channel that extend through each external housing and are aligned along directions that are substantially parallel with the axis.

6. The inverter of claim 5, wherein the cooling channels include transverse cooling channels that (i) extend between the inflowing cooling channel and the outflowing cooling channel and (ii) are configured to direct coolant between adjacent power cards and link capacitors.

7. The inverter of claim 5 further comprising bus terminals extending (i) from the inverting circuitry and the link capacitors and (ii) through the corresponding external housings in a direction that is transverse to the axis.

8. The inverter of claim 5 further comprising switching signal terminals extending (i) from the inverting circuitry of each power card and (ii) through the corresponding external housings in a direction that is transverse to the axis.

9. An inverter comprising:
a plurality of switching units, each switching unit having a primary housing and a circuit disposed within the primary housing, wherein the switching units are configured to convert DC power into AC power; and
a plurality of link capacitors, each link capacitor having a secondary housing and a capacitive element disposed within the secondary housing, wherein the link capacitors are configured to absorb ripple currents, the primary housings are aligned with the secondary housings, and the primary and the secondary housings collectively define cooling channels that extend through each primary housing and each secondary housing.

10. The inverter of claim 9, wherein each primary housing and each secondary housing are aligned along an axis.

11. The inverter of claim 9, wherein the cooling channels include an inlet cooling channel and an outlet cooling channel.

12. The inverter of claim 11, wherein the inlet cooling channel and the outlet cooling channel extend through each primary housing and each secondary housing.

13. The inverter of claim 11, wherein the inlet cooling channel and the outlet cooling channel are substantially parallel.

14. The inverter of claim 11, wherein the cooling channels include transverse cooling channels.

15. The inverter of claim 14, wherein the transverse cooling channels extend between the inlet cooling channel and the outlet cooling channel.

16. The inverter of claim 15, wherein the transverse cooling channels are configured to direct coolant between adjacent power cards and link capacitors.

17. The inverter of claim 9 further comprising bus terminals extending from the switching units and the link capacitors.

18. The inverter of claim 8, wherein the bus terminals extend through the corresponding primary and secondary housings in a direction that is transverse to an alignment of the primary and secondary housings.

19. The inverter of claim 18 further comprising switching signal terminals extending from the switching units of each power card.

20. The inverter of claim 19, wherein the switching signal terminals extend through the corresponding primary housings in a direction that is transverse to an alignment of the primary and secondary housings.

\* \* \* \* \*